US009501079B2

(12) United States Patent
Chen et al.

(10) Patent No.: US 9,501,079 B2
(45) Date of Patent: Nov. 22, 2016

(54) DATA RETENTION VOLTAGE CLAMP

(71) Applicant: TAIWAN SEMICONDUCTOR MANUFACTURING COMPANY, LTD., Hsinchu (TW)

(72) Inventors: Chien-Yuan Chen, Hsinchu (TW); Hau-Tai Shieh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/069,417

(22) Filed: Nov. 1, 2013

(65) Prior Publication Data

US 2015/0123726 A1 May 7, 2015

(51) Int. Cl.

| | |
|---|---|
| ***H01L 35/00*** | (2006.01) |
| ***H01L 37/00*** | (2006.01) |
| ***H03K 3/42*** | (2006.01) |
| ***H03K 17/78*** | (2006.01) |
| ***G05F 3/24*** | (2006.01) |

(52) U.S. Cl.
CPC .................................... *G05F 3/242* (2013.01)

(58) Field of Classification Search
CPC ........ G01K 7/01; G01K 3/005; G01K 7/015; G05F 3/30; H01L 23/34
USPC ........ 327/530, 538, 540, 541, 512, 513, 543
See application file for complete search history.

(56) References Cited

U.S. PATENT DOCUMENTS

| | | | | |
|---|---|---|---|---|
| 5,949,277 | A * | 9/1999 | Iravani | 327/541 |
| 6,166,590 | A * | 12/2000 | Friedman et al. | 327/543 |
| 6,573,780 | B2 * | 6/2003 | Lin et al. | 327/536 |
| 7,477,562 | B2 * | 1/2009 | Seo | 365/222 |
| 7,777,555 | B2 * | 8/2010 | Liao et al. | 327/513 |
| 8,390,491 | B2 * | 3/2013 | Wakimoto | 341/135 |
| 2006/0232321 | A1 * | 10/2006 | Chuang et al. | 327/427 |
| 2008/0074173 | A1 * | 3/2008 | Tu | 327/543 |
| 2010/0182850 | A1 * | 7/2010 | Shiu et al. | 365/189.07 |
| 2012/0081975 | A1 * | 4/2012 | Yamaki | 365/189.07 |

* cited by examiner

*Primary Examiner* — Quan Tra
(74) *Attorney, Agent, or Firm* — Hauptman Ham, LLP

(57) ABSTRACT

An apparatus comprises a first signal input, a first transistor, a first line, a first circuit coupled to the first transistor through the first line, a second line coupled to the first line between the first transistor and the first circuit, a second transistor coupled to the first transistor through the second line, a second circuit coupled to the second transistor, the first circuit being a replica of the second circuit, a second signal input, and a third transistor coupled to the second signal input and the second circuit. The apparatus maintains a virtual voltage of the second circuit above a predetermined threshold by a voltage associated with the second line. The voltage associated with the second line is based on a difference between a first current associated with a portion of the first line and a second current associated with another portion of the first line.

20 Claims, 5 Drawing Sheets

DATA RETENTION VOLTAGE CLAMP

BACKGROUND

Voltage clamps sometimes limit changes that occur in circuit performance caused by changes in one or more variables such as process, voltage, temperature (PVT) variations, resistance, logic, and the like. Some circuits require a minimum virtual voltage to effectively operate. Some voltage clamps include diode-connected p-metal oxide semiconductor (PMOS) transistors that clamp the virtual voltage of a circuit to reduce the effects various process variables have on the virtual voltage, and ultimately, the circuit performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
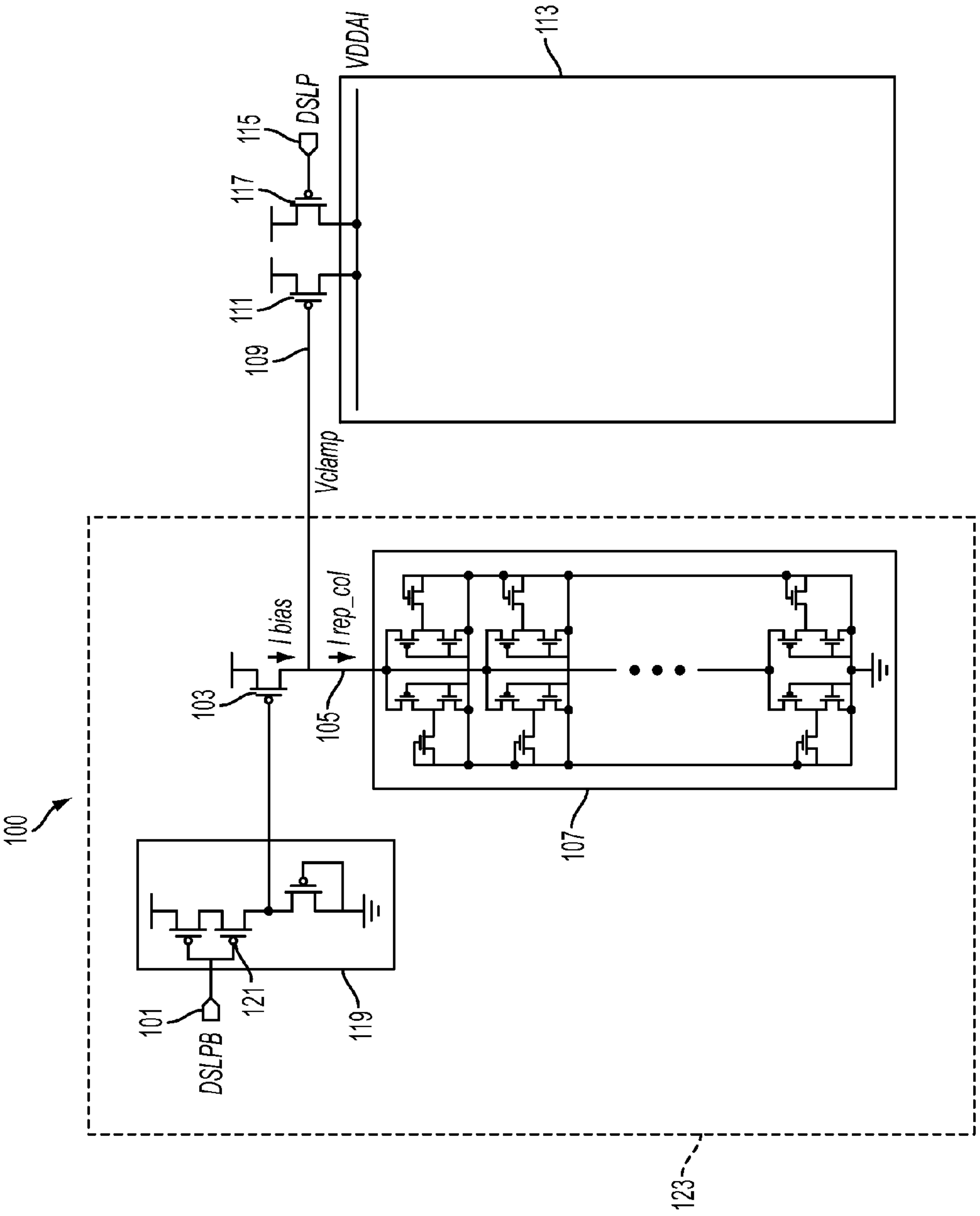
FIG. 1 is a diagram of a circuit configured to maintain a virtual voltage of a memory above a predetermined threshold regardless of a change in one or more process variables, in accordance with one or more embodiments.

The following disclosure provides many different embodiments, or examples, for implementing different features of the invention. Specific examples of components and arrangements are described below to simplify the present disclosure. These are examples and are not intended to be limiting.

Various types of circuits such as, but not limited to, memories have a virtual voltage associated with operation of the circuits (e.g., a bit cell supply voltage). For example, memories have a virtual voltage requirement to effectively operate in a data retention mode. Such data retention modes occur, for example, in deep sleep ("DSLP") modes as indicated by a DSLP signal, command, or logic. As a logic signal received by the circuit changes from an active mode to the DSLP mode, and/or the temperature of the circuit changes, the virtual voltage sufficient to maintain effective operation the circuit changes as well.

To accommodate a change in the virtual voltage sufficient to maintain effective operation of the circuit, some circuits include diode-connected PMOS transistors that clamp the virtual voltage of a circuit to reduce the effects changes in various process variables have on the virtual voltage, and ultimately, circuit performance.

The positive effects of using a diode-connected PMOS transistor as a voltage clamp are limited, however, because diode-connected PMOS transistors are highly susceptible to changes in process variables such as changes in logic, voltage and/or temperature. This susceptibility leads to declining virtual voltage levels in a circuit as process conditions for the circuit worsen.

For example, some PVT simulations using process corner techniques that involve varying process voltage logic and temperatures for test circuits have indicated virtual voltages for circuits (VDDAI) having diode-connected PMOS transistors as voltage clamps widely vary between particular combinations of simulated variables.

For example, some process corner simulations have indicated that the VDDAI of a memory is low at a maximum leakage corner of the process corner simulation in which the memory is at a high input voltage and at a high temperature. But, similar simulations have indicated that VDDAI is high at a worst case leakage corner in which the memory is at a low input voltage and a low temperature.

In other process corner simulations of a circuit having a diode-connected PMOS transistor as a voltage clamp, a best case simulation condition having an ultra low voltage logic at fast-fast (FF), with the memory at a slow-slow (SS) level, and a temperature of −40° C., yielded a VDDAI of 717 mV. A typical case simulation condition having a low voltage logic at typical-typical (TT), the memory at TT, and a temperature of 25° C., indicated a VDDAI drop to 596.8 mV. A worst case simulation condition having standard voltage logic at SS, the memory at FF, and the temperature of the memory at 125° C., indicated a VDDAI drop to 309.9 mV.

Bit line lengths of a memory also affect the VDDAI of the memory. For example, as bit line lengths increase from 8 bit to 256 bit, with the strength of diode-connected PMOS transistor being the same, VDDAI decreases.

Simulations illustrating the effects of bit line length on VDDAI, given a same voltage logic and temperature condition and only varying the length of the bit line yielded a VDDAI of 562 mV for a bit line length of 8 bits, a VDDAI of 541 mV for a bit line length of 16 bits, a VDDAI of 512 mV for a bit line length of 32 bits, a VDDAI of 479 mV for a bit line length of 64 bits, a VDDAI of 443 mV for a bit line length of 128 bits, a VDDAI of 399 mV for a bit line length of 264 bits.

For a circuit having a diode-connected PMOS voltage clamp, in a data retention mode established by a DSLP mode or DSLP signal at a logical [1], VDDAI is determined based on a memory current leakage and a current associated with the diode-connected PMOS transistor voltage clamp. Keeping VDDAI at an acceptable level can be difficult, for example, an a worst case scenario, at a standard or typical voltage logic where the temperature is high and the bit line length is long, the VDDAI is caused to be very low and the diode-connected PMOS transistor voltage clamp is not very effective. In a best case scenario, at an ultra low voltage logic where the temperature is low and the bit line length is short, the conventional diode-connected PMOS transistor voltage clamp managed to keep the VDDAI at a high level.

Unfortunately, as temperatures increase, a data retention voltage (DRV) sufficient to provide effective operation of a memory increases when the memory is in a data retention mode. Accordingly, it would be advantageous to provide a voltage clamp approach that is robust across various process voltage and temperature (PVT) conditions, thresholds, and bit-line lengths. Such an approach is capable of tracking a bit line length of a memory and providing suitable adaptive feedback to keep VDDAI at an effective level for the data retention voltage in the data retention mode.

FIG. 1 is a diagram of a circuit 100 configured to maintain a virtual voltage of a memory above a predetermined threshold regardless of a change in one or more process variables, in accordance with one or more embodiments.

The circuit 100 includes a first signal input 101 configured to receive a first input signal, a first transistor 103 coupled to the first signal input 101, a first line 105, a first circuit 107 coupled to the first transistor 103 through the first line 105, a second line 109 coupled to the first line 105 between the first transistor 103 and the first circuit 107, a second transistor 111 coupled to the first transistor 103 through the second line 109, a second circuit 113 coupled to the second transistor 111, a second signal input 115 configured to receive a second input signal, a third transistor 117 coupled to the second signal input 115 and the second circuit 113.

The first circuit 107 is a replica of the second circuit 113. In some embodiments, the first circuit 107 is identical to the second circuit 113. In other embodiments, the first circuit 107 is a configurable replica column that is capable of replicating the function of the second circuit 113 and have the same or at least similar performance properties as the second circuit 113.

A virtual voltage VDDAI of the second circuit 113 is maintained above a predetermined threshold by an adaptive voltage Vclamp associated with the second line 109. The voltage Vclamp associated with the second line is based, at least in part, on a difference between a first current Ibias and a second current Irep_col. The first current Ibias is associated with a portion of the first line 105 between the first transistor 103 and the second line 109. The second current Irep_col is associated with another portion of the first line 105 between the second line 109 and the first circuit 107. Some of the Ibias current is leaked to the first circuit 107 as Irep_col.

In some embodiments, the voltage Vclamp associated with the second line 109 is a clamp voltage configured to provide process variation protection, shielding, compensation, and/or immunity to the second circuit 113. In some embodiments, one or more of the first circuit 107 and the second circuit 113 is a memory. In one or more embodiments, the memory comprises any of an SRAM, RAM, a PROM, an EPROM, a FLASH-EPROM, an EEPROM, or other suitable memory configuration.

In some embodiments, for different thresholds in temperature, the second current Irep_col changes proportionally with a change in temperature, the voltage Vclamp associated with the second line 109 changes inversely proportionally with a change in temperature, and the virtual voltage VDDAI of the second circuit 113 changes proportionally with a change in temperature thereby maintaining the virtual voltage VDDAI of the second circuit 113 above the predetermined threshold as a temperature of the second circuit 113 from a first temperature to a second temperature.

For example, for different thresholds in temperature, the second current Irep_col increases, the voltage Vclamp associated with the second line 109 decreases, and the virtual voltage VDDAI of the second circuit 113 increases thereby maintaining the virtual voltage VDDAI of the second circuit 113 above the predetermined threshold as a temperature of the second circuit 113 increases from a first temperature to a second temperature.

In some embodiments, for different thresholds in logic, or change in the input signal, the first current Ibias changes inversely proportionally with a change in voltage logic, the voltage Vclamp associated with the second line 109 changes inversely proportionally with a change in voltage logic, and the virtual voltage VDDAI of the second circuit 113 changes proportionally with a change in voltage logic thereby maintaining the virtual voltage VDDAI of the second circuit 113 above the predetermined threshold as a first signal input changes from a starting first input signal to an ending first input signal and a second signal input changes from a starting second input signal to an ending second input signal.

For example, for different thresholds in voltage logic, the first current Ibias decreases, the voltage Vclamp associated with the second line 109 decreases, and the virtual voltage VDDAI of the second circuit 113 increases thereby maintaining the virtual voltage VDDAI of the second circuit 113 above the predetermined threshold as a first input signal changes from a starting first input signal having an ultra-low voltage logic to an ending first input signal having a standard voltage logic and a second input signal changes from a starting second input signal having an ultra-low voltage logic to an ending second input signal having a standard voltage logic.

In some embodiments, the first signal input 101 and the second signal input 115 are associated with a first input signal that indicates a deep sleep mode DSLP and a second input signal that indicates a deep sleep bar DSLPB (i.e., an inversion of the DSLP signal).

The deep sleep mode DSLP and/or DSLPB are modes activated by the first input signal received by the first signal input 101 and the second input signal received by the second signal input 115 indicating a logical [1] that is indicative of the DSLP mode and, accordingly, the data retention mode. The data retention mode, as discussed above, has predetermined threshold powers that are suitable for the second memory 113 in a data retention mode, such that the data retention mode is effective.

In some embodiments, the second circuit 113 comprises a bit line length, and the virtual voltage VDDAI of the second circuit 113 is maintained above the predetermined threshold regardless of the bit line length of the second circuit 113.

In one or more embodiments, the first transistor 103 is a PMOS transistor. In some embodiments, the second transistor 111 is a PMOS transistor and the third transistor 117 is a PMOS transistor.

In some embodiments, the circuit 100 further comprises a bias circuit 119 comprising one or more bias circuit transistors 121. The bias circuit 119 is configured to provide a bias voltage with PVT immunity such as the voltage Vclamp. The bias circuit 119 is coupled to the first transistor 103 between the first signal input 101 and the first transistor 103. The first current Ibias, accordingly, is a bias current. In some embodiments, the one or more bias circuit transistors 121 are the same type of transistor. In some embodiments, the one or more bias circuit transistors are all PMOS transistors. If all of the transistors 121 are PMOS transistors, complete population of PMOS transistors reduces any variation caused by a PMOS/NMOS ratio on the performance of the circuit 100.

In one or more embodiments, the first signal input 101, the first transistor 103, the first line 105, the first circuit 107 and the second line 109 are together configured as a modular voltage clamp circuit 123. The second line 109 of the voltage clamp circuit 123 is configured to be coupled to the second circuit 113, and first circuit 107 is configurable to replicate the second circuit 113. The modular voltage clamp circuit 123 is configured to maintain the virtual voltage VDDAI of the second circuit 113 above a predetermined threshold by supplying the clamp voltage Vclamp associated with the second line 109 to the second circuit 113. The second circuit 113 is any type of circuit that the first circuit 107 is capable of replicating.

In some embodiments, the circuit 100 includes a processor such as processor 503 or a control module implemented in chip set 500 such as that discussed with respect to FIG. 5 below, in communication with one or more of the first signal input 101, the second signal input 115, the first circuit 107, the second circuit 113, to control various features of the circuit 100 and/or supply one or more signals or commands such as the first input signal received by the first signal input 101 and the second input signal received by the second signal input 115 to the circuit 100. In various embodiments, the processor or control module is in communication with the circuit 100 by any of a wired or wireless connection.

Figure 2:
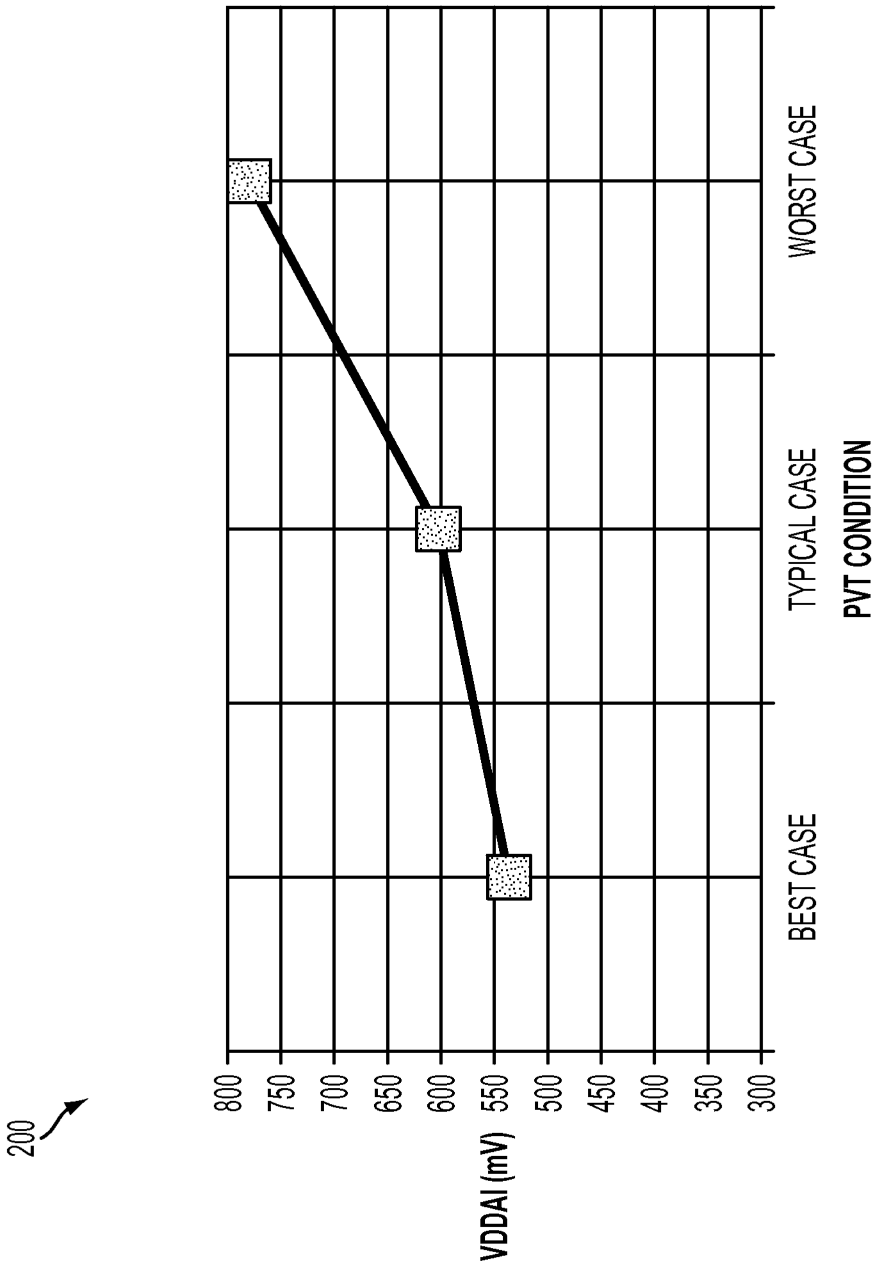
FIG. 2 is a chart illustrating the effectiveness of a voltage clamp circuit illustrated in FIG. 1, in accordance with one or more embodiments.

FIG. 2 is a chart 200 illustrating the results of a simulation to determine the effectiveness of the voltage clamp circuit 123, in accordance with one or more embodiments. In this example, as various PVT conditions were changed from a best case scenario, to a typical case scenario, to a worst case scenario for the circuit 100, the voltage clamp circuit 123 caused the virtual voltage VDDAI of the second circuit 113 to increase as the combination of PVT conditions goes from best to worst. The determined virtual voltage increase as process conditions worsened for the circuit 100 was exactly the opposite as that which would have occurred is a diode-connected PMOS transistor was used as the voltage clamp.

Figure 3:
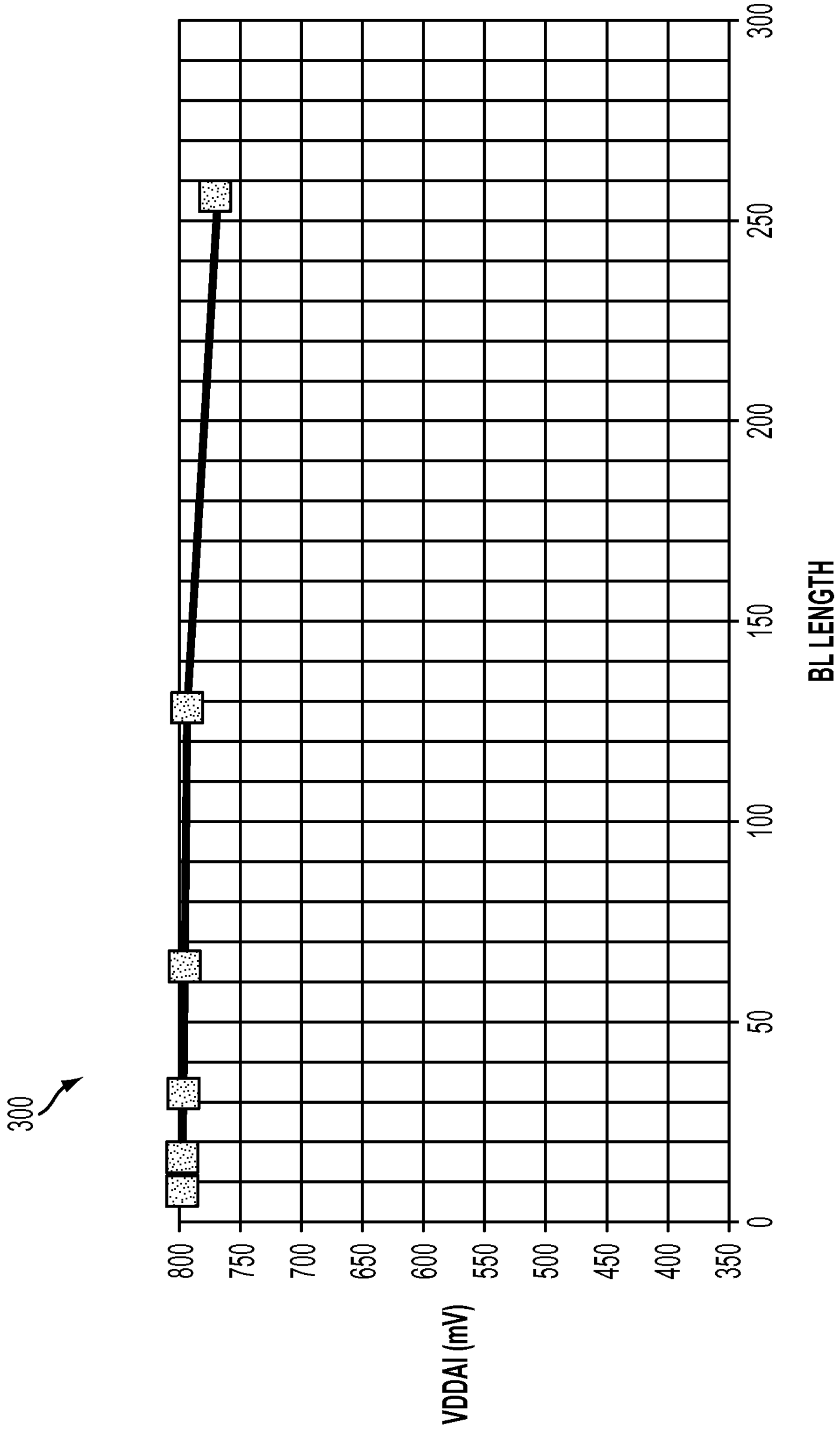
FIG. 3 is a chart illustrating the effectiveness of a voltage clamp circuit illustrated in FIG. 1, in accordance with one or more embodiments.

FIG. 3 is a chart 300 illustrating the results of a simulation to determine the effectiveness of the voltage clamp circuit 123, in accordance with one or more embodiments. In this example, performance of the circuit 100 was tested for differing bit line lengths of the second circuit 113 that ranged from 8 bits to 264 bits. As the bit line length increased, the variation between the virtual voltage VDDAI decreased as shown in chart 300, or less than about 5%. A variation of VDDAI that is less than about 5% is a significant improvement over a diode-connected PMOS transistor voltage clamp such as that discussed above which experiences a VDDAI drop of about 28%.

Figure 4:
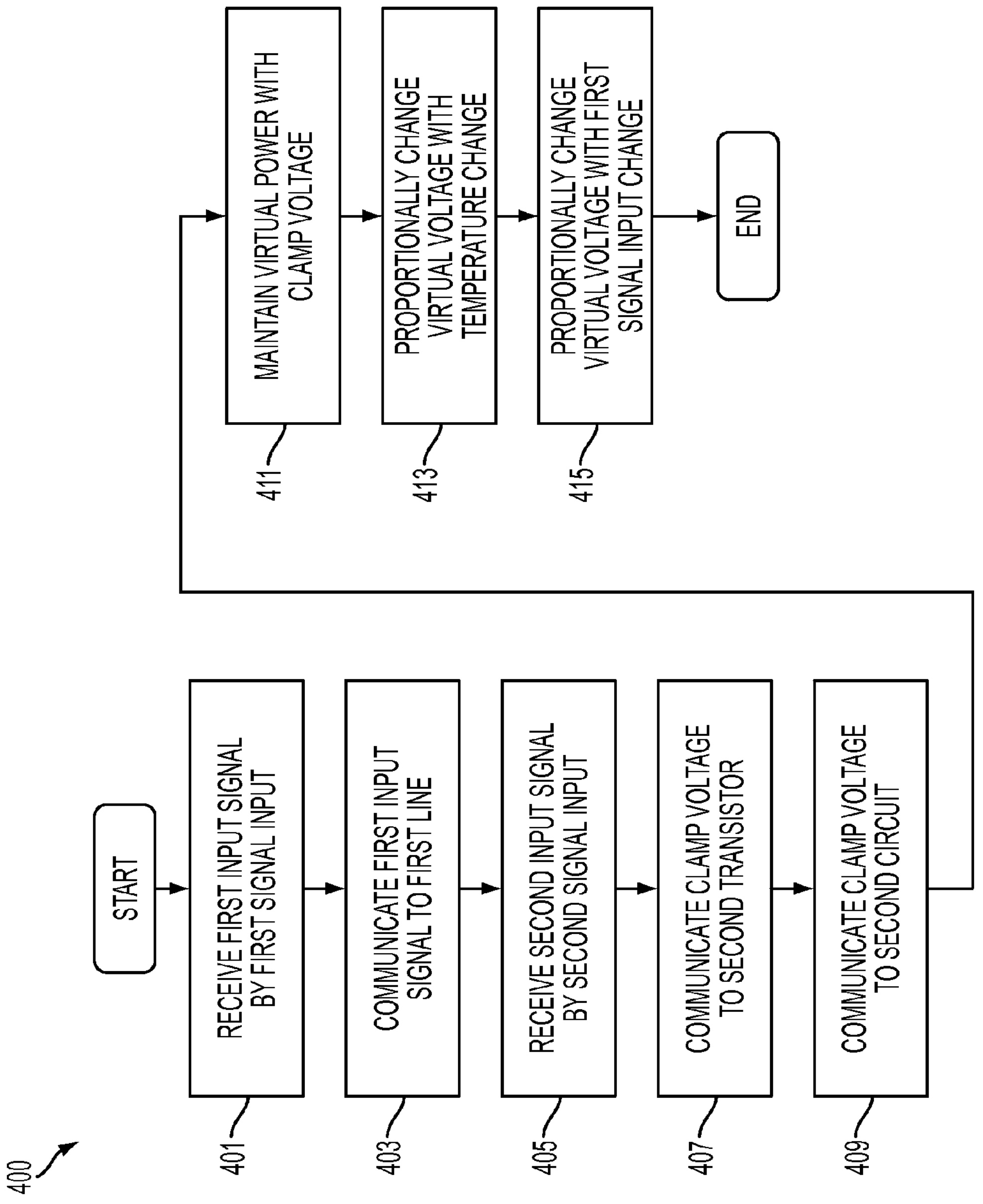
FIG. 4 is a flow chart of a method of maintaining a virtual voltage of a circuit above a predetermined threshold, in accordance with one or more embodiments.

FIG. 4 is a flowchart of a method 400 of maintaining a virtual voltage of a circuit above a predetermined threshold, in accordance with one or more embodiments. In some embodiments, method 400 is implemented by a circuit such as a circuit including one or more components of the circuit 100 discussed above. In other embodiments, method 400 is performed by a processor such as processor 503 or a control module implemented in chip set 500 such as that discussed with respect to FIG. 5, discussed below.

Method 400 begins with step 401 in which a first signal input receives a first input signal and communicates the first input signal to a first transistor coupled to the first signal input. The first input signal is a DSLP signal indicative of a data retention mode. In step 403, the first transistor communicates the first input signal to a first line. The first transistor is coupled to a first circuit by the first line. In step 405, a second signal input receives a second input signal and communicates the second input signal to a third transistor. The second input signal is a DSLPB signal indicative of the data retention mode. The third transistor is coupled to the second signal input and the second circuit. In step 407, a clamp voltage is communicated to a second transistor through a second line. The second line is coupled to the first line between the first transistor and the first circuit. The second transistor is coupled to the first transistor through the second line. The clamp voltage is based, at least in part, on a difference between a first current and a second current. The first current is associated with a portion of the first line between the first transistor and the second line. The second current is associated with another portion of the first line between the second line and the first circuit.

In step 409, the second transistor communicates the clamp voltage to a second circuit, the first circuit being a replica of the second circuit. The second circuit is coupled to the second transistor.

In step 411, the clamp voltage supplied by to the second circuit maintains a virtual voltage of the second circuit above a predetermined threshold. The clamp voltage is adaptive to various process conditions and, as discussed above, is based on the difference between the first current and the second current and adapts regardless of changes in voltage logic and temperature conditions, and/or a bit line length of the second circuit to maintain the virtual voltage of the second circuit above the predetermined threshold.

In step 413, the second current changes proportionally with a change in temperature of the second circuit from a first temperature to a second temperature, the clamp voltage changes inversely proportionally with the change in temperature of the second circuit from the first temperature to the second temperature, and the virtual voltage of the second circuit changes proportionally with the change in temperature of the second circuit from the first temperature to the second temperature, thereby maintaining the virtual voltage of the second circuit above the predetermined threshold as the temperature of the second circuit changes from the first temperature to the second temperature.

In step 415, the first current changes inversely proportionally with a change in the first input signal from a starting first input signal to an ending first input signal and a change in the second input signal from a starting second input signal to an ending second input signal, the clamp voltage changes inversely proportionally with the change in the first input signal from the starting first input signal to the ending first input signal and the change in the second input signal from the starting second input signal to the ending second input signal, and the virtual voltage of the second circuit changes proportionally with the change in the first input signal from the starting first input signal to the ending first input signal and the change in the second input signal from the starting second input signal to the ending second input signal, thereby maintaining the virtual voltage of the second circuit above the predetermined threshold as the first voltage changes and the second voltage changes.

The processes described herein for maintaining a virtual voltage of a circuit above a predetermined threshold by supplying a clamp voltage to the circuit may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 5:
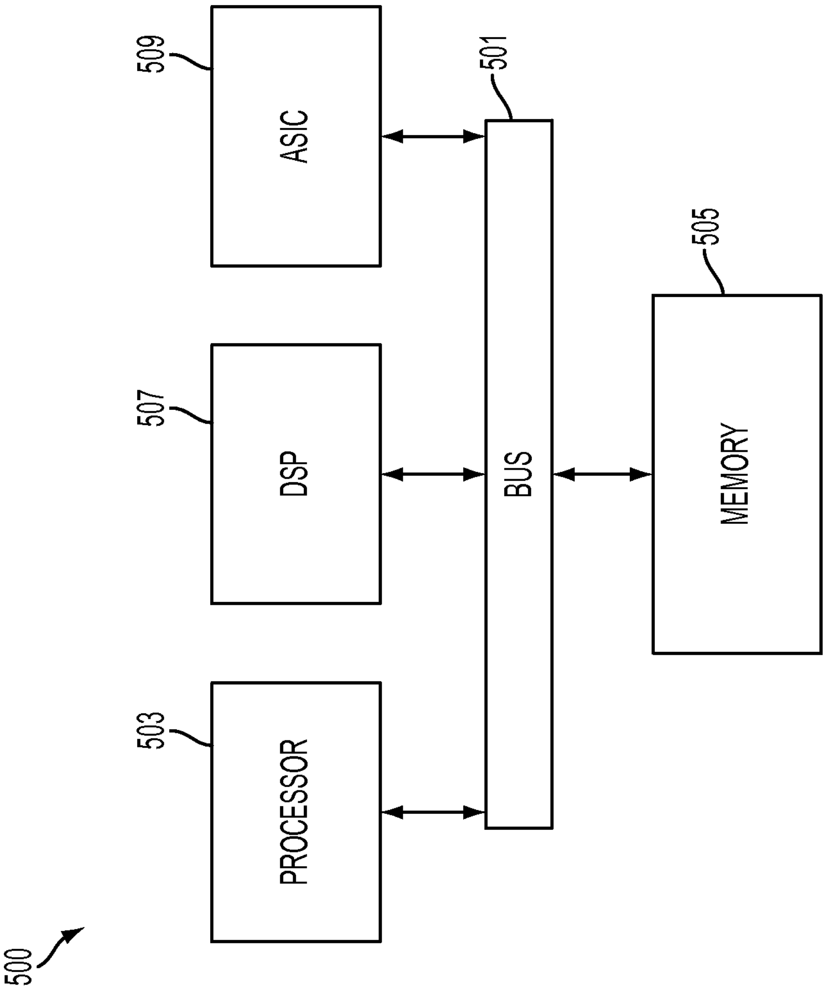
FIG. 5 illustrates a chip set or chip upon which or by which an embodiment is implemented.

FIG. 5 illustrates a chip set or chip 500 upon which or by which an embodiment is implemented. Chip set 500 is programmed to maintain a virtual voltage of a circuit above a predetermined threshold by supplying a clamp voltage to the circuit, as described herein, and includes, for example, bus 501, processor 503, memory 505, DSP 507 and ASIC 509 components.

The processor 503 and memory 505 are incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. In some embodiments, the chip set 500 are implemented in a single chip. In some embodiments, the chip set or chip 500 is implemented as a single "system on a chip." It is further contemplated that in certain embodiments a separate ASIC is not be used, for example, and all relevant functions as disclosed herein are performed by a processor or processors, e.g., processor 503. Chip set or chip 500, or a portion thereof, constitutes a mechanism for performing one or more steps of maintaining a virtual voltage of a circuit above a predetermined threshold by supplying a clamp voltage to the circuit.

In one or more embodiments, the chip set or chip 500 includes a communication mechanism such as bus 501 for passing information among the components of the chip set 500. Processor 503 has connectivity to the bus 501 to execute instructions and process information stored in, for example, the memory 505. In some embodiments, the processor 503 is also accompanied with one or more specialized components to perform certain processing functions and tasks such as one or more digital signal processors (DSP) 507, or one or more application-specific integrated circuits (ASIC) 509. A DSP 507 typically is configured to process real-world signals (e.g., sound) in real time independently of the processor 503. Similarly, an ASIC 509 is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 503 performs a set of operations on information as specified by computer program code related to maintain a virtual voltage of a circuit above a predetermined threshold by supplying a clamp voltage to the circuit. The computer program code is a set of instructions or statements providing instructions for the operation of the processor and/or the computer system to perform specified functions.

The processor 503 and accompanying components have connectivity to the memory 505 via the bus 501. The memory 505 includes one or more of dynamic memory (e.g., RAM, magnetic disk, writable optical disk, etc.) and static memory (e.g., ROM, CD-ROM, etc.) for storing executable instructions that when executed perform the steps described herein to maintain a virtual voltage of a circuit above a predetermined threshold by supplying a clamp voltage to the circuit. The memory 505 also stores the data associated with or generated by the execution of the steps.

In one or more embodiments, the memory 505, such as a random access memory (RAM) or any other dynamic storage device, stores information including processor instructions for maintaining a virtual voltage of a circuit above a predetermined threshold by supplying a clamp voltage to the circuit. Dynamic memory allows information stored therein to be changed by system 100. RAM allows a unit of information stored at a location called a memory address to be stored and retrieved independently of information at neighboring addresses. The memory 505 is also used by the processor 503 to store temporary values during execution of processor instructions. In various embodiments, the memory 505 is a read only memory (ROM) or any other static storage device coupled to the bus 501 for storing static information, including instructions, that is not changed by the system 100. Some memory is composed of volatile storage that loses the information stored thereon when power is lost. In some embodiments, the memory 505 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 503, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, or another medium from which a computer can read. The term computer-readable storage medium is used herein to refer to a computer-readable medium.

One aspect of this description relates to an apparatus comprising, a first signal input, a first transistor coupled to the first signal input, a first line, a first circuit coupled to the first transistor through the first line a second line coupled to the first line between the first transistor and the first circuit a second transistor coupled to the first transistor through the second line, a second circuit coupled to the second transistor, the first circuit being a replica of the second circuit, a second signal input, and a third transistor coupled to the second signal input and the second circuit. The apparatus is configured to maintain a virtual voltage of the second circuit above a predetermined threshold by a voltage associated with the second line, the voltage associated with the second line being based, at least in part, on a difference between a first current and a second current, the first current being associated with a portion of the first line between the first transistor and the second line, and the second current being associated with another portion of the first line between the second line and the first circuit.

Another aspect of this description relates to a method comprising communicating a received first input signal from a first signal input to a first transistor coupled to the first signal input. The method also comprises communicating the first input signal from the first transistor to a first line, the first transistor being coupled to a first circuit by the first line. The method further comprises communicating a clamp voltage to a second transistor through a second line, the second line being coupled to the first line between the first transistor and the first circuit, the second transistor being coupled to the first transistor through the second line, the clamp voltage being based, at least in part, on a difference between a first current and a second current, the first current being associated with a portion of the first line between the first transistor and the second line, and the second current being associated with another portion of the first line between the second line and the first circuit.

The method additionally comprises communicating the clamp voltage from the second transistor to a second circuit coupled to the second transistor, the first circuit being a replica of the second circuit. The method also comprises communicating a second input signal from a second signal input to a third transistor, the third transistor being coupled to the second signal input and the second circuit. The method further comprises maintaining a virtual voltage of the second circuit above a predetermined threshold by supplying the clamp voltage to the second circuit.

Still another aspect of this description relates to a voltage clamp circuit comprising a signal input, a transistor coupled to the signal input, a first line, a first circuit coupled to the transistor through the first line, and a second line coupled to the first line between the first transistor and the first circuit, the second line being configured to be coupled to a second circuit, the first circuit being configurable to replicate the second circuit. The signal input, the transistor, the first line, the first circuit and the second line are together configured to maintain a virtual voltage of the second circuit above a predetermined threshold by supplying a clamp voltage associated with the second line, the clamp voltage associated with the second line being based, at least in part, on a difference between a first current and a second current, the first current being associated with a portion of the first line between the first transistor and the second line, and the second current being associated with another portion of the first line between the second line and the first circuit.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. An apparatus comprising:

a first signal input;

a first transistor coupled to the first signal input;

a first line;

a first circuit coupled to the first transistor through the first line;

a second line coupled to the first line between the first transistor and the first circuit;

a second transistor coupled to the first transistor through the second line;

a second circuit coupled to the second transistor, the first circuit being a replica of the second circuit;

a second signal input; and a third transistor coupled to the second signal input and the second circuit, wherein the apparatus is configured to maintain a virtual voltage of the second circuit above a predetermined, positive threshold by way of a clamp voltage associated with the second line, the clamp voltage is based on a difference between a first current and a second current and is independent of the virtual voltage, the first current is associated with a portion of the first line between the first transistor and the second line, the second current is associated with another portion of the first line between the second line and the first circuit, and the apparatus is configured to maintain the virtual voltage having process variation immunity to the second circuit by clamp voltage changes proportionally based on the first current and the second current.

2. The apparatus of claim 1, wherein the second circuit is a memory.

3. The apparatus of claim 1, wherein, in use, the second current changes proportionally with a change in temperature of the second circuit;

the clamp voltage changes inversely proportionally with the change in temperature of the second circuit; and the virtual voltage of the second circuit changes proportionally with the change in temperature of the second circuit, thereby maintaining the virtual voltage of the second circuit above the predetermined threshold as the temperature of the second circuit changes from a first temperature to a second temperature.

4. The apparatus of claim 1, wherein, in use, the first current changes inversely proportionally with a change in a first input signal received by the first signal input and a change in a second input signal received by the second signal input;

the clamp voltage changes inversely proportionally with the change in the first input signal and the change in the second input signal; and the virtual voltage of the second circuit changes proportionally with the change in the first input signal and the change in the second input signal, thereby maintaining the virtual voltage of the second circuit above the predetermined threshold as the first input signal changes from a starting first input signal to an ending first input signal and the second input signal changes from a starting second input signal to an ending second input signal.

5. The apparatus of claim 4, wherein, in use, the first input signal and the second input signal are inverses of each other.

6. The apparatus of claim 1, wherein, in use, a first input signal received by the first signal input and a second input signal received by the second signal input are signals associated with a deep sleep mode having a voltage logic.

7. The apparatus of claim 6, wherein the deep sleep mode is indicative of a data retention mode.

8. The apparatus of claim 1, further comprising:

a bias circuit comprising one or more bias circuit transistors, the bias circuit being coupled to the first transistor between the first signal input and the first transistor, wherein the first current is a bias current.

9. The apparatus of claim 8, wherein the one or more bias circuit transistors are PMOS transistors.

10. The apparatus of claim 1, wherein the second circuit comprises a bit line length and the virtual voltage of the second circuit is maintained above the predetermined threshold regardless of the bit line length of the second circuit.

11. A method comprising:

communicating a first input signal received by a first signal input to a first transistor coupled to the first signal input;

communicating the first input signal from the first transistor to a first line, the first transistor being coupled to a first circuit by the first line;

communicating a clamp voltage to a second transistor through a second line, the second line being coupled to the first line between the first transistor and the first circuit, the second transistor being coupled to the first transistor through the second line, the clamp voltage being based on a difference between a first current and a second current, the first current being associated with a portion of the first line between the first transistor and the second line, and the second current being associated with another portion of the first line between the second line and the first circuit;

communicating the clamp voltage from the second transistor to a second circuit, the second circuit being coupled to the second transistor, the first circuit being a replica of the second circuit;

communicating a second input signal received by a second signal input to a third transistor, the third transistor being coupled to the second signal input and the second circuit;

maintaining a virtual voltage of the second circuit above a predetermined threshold by supplying the clamp voltage to the second circuit; and maintaining the virtual voltage having process variation immunity to the second circuit by making clamp voltage changes proportionally based on the first current and the second current.

12. The method of claim 11, wherein maintaining the virtual voltage having process variation immunity to the second circuit by making clamp voltage changes proportionally based on the first current and the second current comprises:

proportionally changing the second current with a change in temperature of the second circuit;

inversely proportionally changing the clamp voltage with the change in temperature of the second circuit; and proportionally changing the virtual voltage of the second circuit with the change in temperature of the second circuit, thereby maintaining the virtual voltage of the second circuit above the predetermined threshold as the temperature of the second circuit changes from a first temperature to a second temperature.

13. The method of claim 11, wherein maintaining the virtual voltage having process variation immunity to the second circuit by making clamp voltage changes proportionally based on the first current and the second current comprises:

inversely proportionally changing the first current with a change in the first input signal and a change in the second input signal;

inversely proportionally changing the clamp voltage with the change in the first input signal and the change in the second input signal; and proportionally changing the virtual voltage of the second circuit with the change in the first input signal and the change in the second input signal, thereby maintaining the virtual voltage of the second circuit above the predetermined threshold as the first input signal changes from a starting first input signal to an ending first input signal and the second input signal changes from a starting second input signal to an ending second input signal.

14. The method of claim 11, wherein the first input signal received by the first signal input and the second input signal received by the second signal input are signals associated with a deep sleep mode having a voltage logic, and the second input signal is the inverse of the first input signal.

15. The method of claim 11, wherein the second circuit comprises a bit line length and the virtual voltage of the second circuit is maintained above the predetermined threshold regardless of the bit line length of the second circuit.

16. A voltage clamp circuit comprising:

a signal input;

a transistor coupled to the signal input;

a first line;

a first circuit coupled to the transistor through the first line; and a second line coupled to the first line between the first transistor and the first circuit, the second line being configured to be coupled to a second circuit, the first circuit being configurable to replicate the second circuit;

wherein the signal input, the transistor, the first line, the first circuit and the second line are together configured to maintain a virtual voltage of the second circuit above a predetermined threshold within a 5% deviation of an initial virtual voltage value by supplying a clamp voltage associated with the second line, the clamp voltage associated with the second line being:

based, at least in part, on a difference between a first current and a second current, the first current being associated with a portion of the first line between the first transistor and the second line, and the second current being associated with another portion of the first line between the second line and the first circuit; and controlled to maintain the virtual voltage having process variation immunity to the second circuit by making clamp voltage changes proportionally based on the first current and the second current.

17. The voltage clamp circuit of claim 16, wherein, in use, the second current increases, the clamp voltage associated with the second line decreases, and the virtual voltage of the second circuit increases thereby maintaining the virtual voltage of the second circuit above the predetermined threshold as a temperature of the second circuit increases from a first temperature to a second temperature;

the first current decreases, the clamp voltage associated with the second line decreases, and the virtual voltage of the external device increases thereby maintaining the virtual voltage of the second circuit above the predetermined threshold as a first input signal changes from a starting first input signal having a first voltage logic to an ending first input signal having a second voltage logic, the second voltage logic being greater than the first voltage logic; and the virtual voltage of the second circuit is maintained above the predetermined threshold regardless of a bit line length of the second circuit.

18. The apparatus of claim 1, wherein the predetermined threshold is within a 5% deviation of an initial virtual voltage value.

19. The apparatus of claim 4, wherein the change in the first input signal is based on a change in a voltage logic of the first input signal.

20. The method of claim 11, wherein maintaining the virtual voltage of the second circuit above the predetermined threshold comprises maintaining the virtual voltage of the second circuit within a 5% deviation of an initial virtual voltage value.

* * * * *